United States Patent [19]

Ohata et al.

[11] Patent Number: 5,065,212
[45] Date of Patent: Nov. 12, 1991

[54] SEMICONDUCTOR DEVICE

[75] Inventors: Yu Ohata, Tokyo; Tsuyoshi Kuramoto, Yokohama, both of Japan

[73] Assignee: Kabushiki Kaisha Toshiba, Kawasaki, Japan

[21] Appl. No.: 436,004

[22] Filed: Nov. 13, 1989

Related U.S. Application Data

[63] Continuation of Ser. No. 161,436, Feb. 24, 1988, abandoned, which is a continuation of Ser. No. 68,754, Jun. 29, 1987, abandoned, which is a continuation of Ser. No. 719,263, Apr. 2, 1985, abandoned.

[30] Foreign Application Priority Data

Apr. 4, 1984 [JP] Japan .................................. 59-67081

[51] Int. Cl.$^5$ ............................................ H01L 27/02
[52] U.S. Cl. .................................... 357/42; 357/23.4;
357/43; 437/6; 437/40; 437/59
[58] Field of Search .................... 357/23.4, 42, 43;
437/6, 59, 40; 156/605

[56] References Cited

U.S. PATENT DOCUMENTS

| | | | |
|---|---|---|---|
| 4,224,634 | 9/1980 | Svedberg . | |
| 4,364,073 | 12/1982 | Becke et al. | 357/23.4 |
| 4,417,385 | 11/1983 | Temple . | |
| 4,477,310 | 10/1984 | Park et al. | 357/41 |
| 4,543,592 | 9/1985 | Itsumi et al. . | |
| 4,546,370 | 10/1985 | Curran . | |
| 4,589,004 | 5/1986 | Yasuda et al. | 357/43 |
| 4,659,421 | 6/1987 | Jewett | 156/605 |
| 4,680,604 | 7/1987 | Nakagawa et al. . | |
| 4,879,584 | 11/1989 | Takagi et al. | 357/43 |
| 4,887,142 | 12/1989 | Bertotti et al. | 357/43 |
| 4,928,159 | 5/1990 | Mihara et al. | 357/42 |

FOREIGN PATENT DOCUMENTS

| | | |
|---|---|---|
| 0080044 | 6/1983 | European Pat. Off. . |
| 2524710 | 10/1983 | France . |
| 2088631 | 6/1982 | United Kingdom . |

OTHER PUBLICATIONS

Wrathall et al., "Integrated Circuits for the Control of High Power", IEDM, pp. 408-411, 1983.
A. Goodman et al., "Improved COMFETS", 1983 IEDM, Conf. Proc., pp. 79-82.
Electronic Design, vol. 30, No. 7, Mar. 31, 1982, pp. 69-77; T. E. Ruggles et al.: "Mixed Process Puts High Power Under Fine Control".
IEEE Transactions on Electron Devices, vol. ED-30, No 12, Dec. 1983, pp. 1785-1791; T. Fukushima et al.; "An Advanced SVG Technology for 64 k Junction--Shorting PROM's ".
New Electronics, vol. 17, No. 4, Feb. 21, 1984, pp. 58, 59; P. Alois: "The Power Integrated Circuit".
Electronic Design, vol. 33, No. 4, Feb. 21, 1985, pp. 191-194, 196, 198; W. Schultz et al.: "Mixed MOS Devices Unite in a Switch Chip that Links Power with Smarts".

Primary Examiner—Rolf Hille
Assistant Examiner—Steven Loke
Attorney, Agent, or Firm—Finnegan, Henderson, Farabow, Garrett, and Dunner

[57] ABSTRACT

There is a semiconductor device in which an n-type layer formed on a p$^+$-type substrate is divided into first and second device forming regions by an isolation region and drive circuit devices and an output circuit device are respectively formed in these first and second device forming regions. The output circuit device is a conductivity modulated MOS transistor having the p$^+$-type substrate as a drain and the second device forming regoin as a high resistance region whose conductivity is modulated.

13 Claims, 4 Drawing Sheets

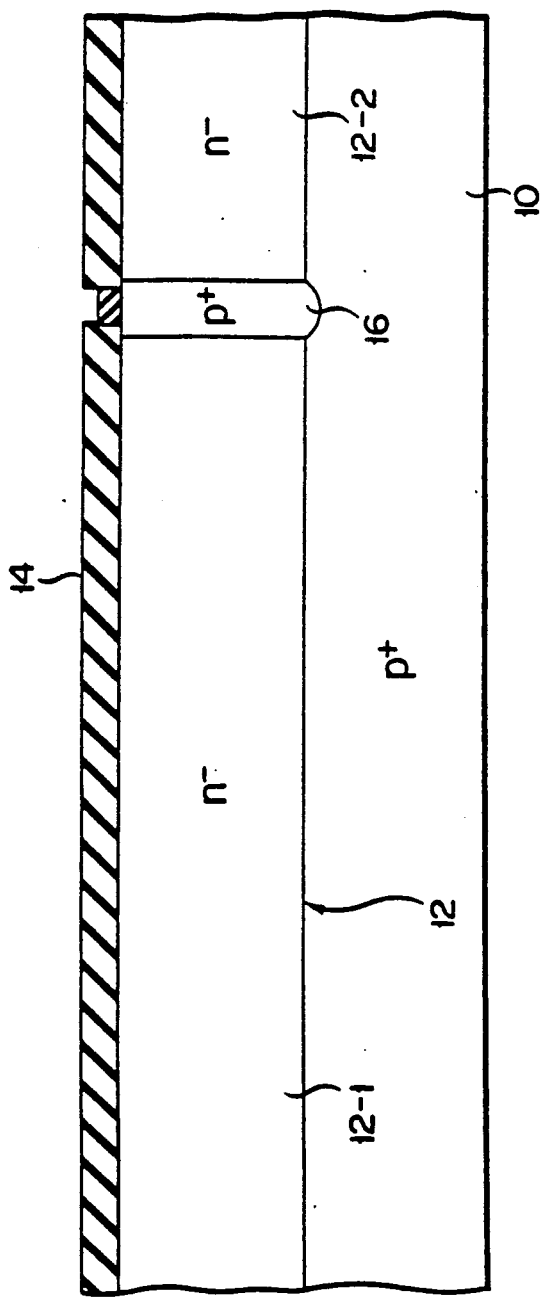
F I G. 2A
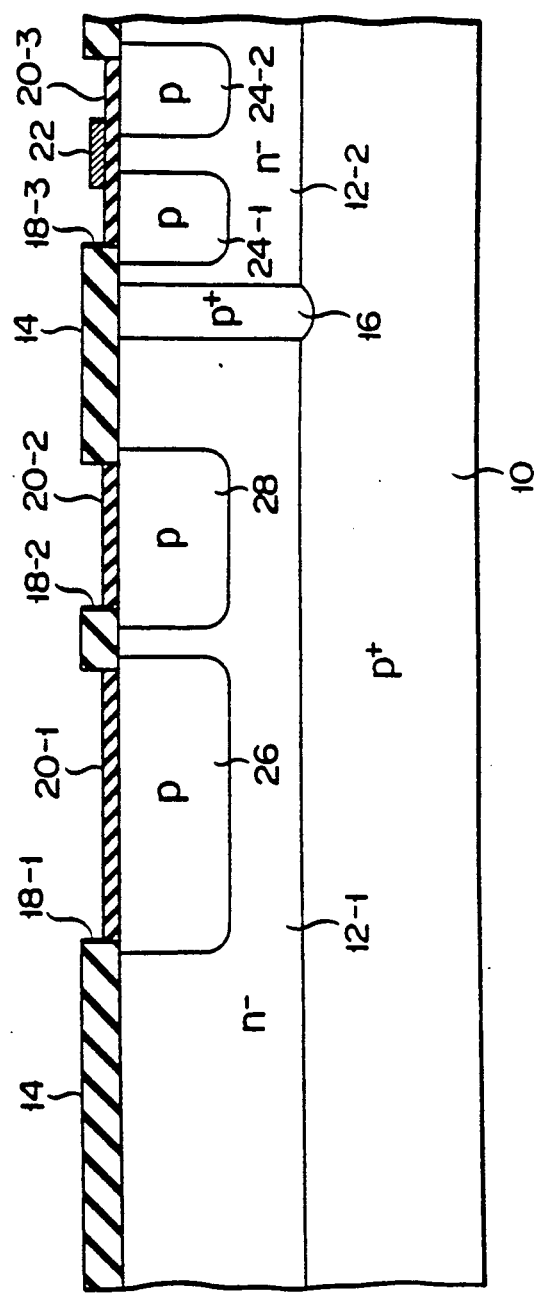
F I G. 2B

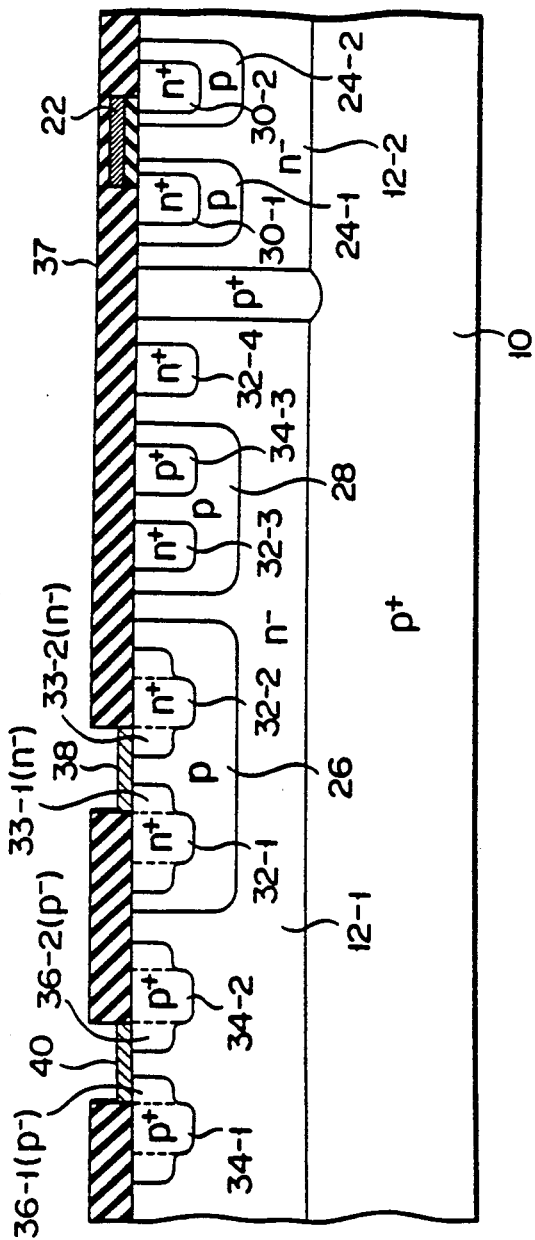
F I G. 2C
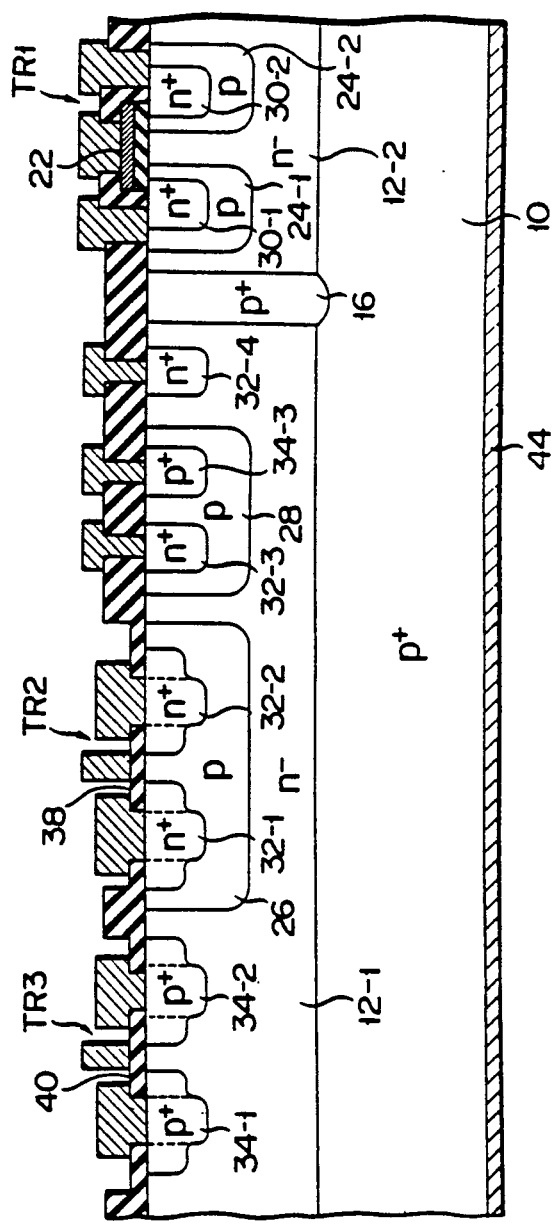
F I G. 2D

SEMICONDUCTOR DEVICE

This is a continuation of application Ser. No. 07/161,436, filed Feb. 24, 1988, which is a continuation of application Ser. No. 07/068,754, filed Jun. 29, 1987, which is a continuation of application Ser. No. 06/719,263, filed Apr. 2, 1985, all now abandoned.

BACKGROUND OF THE INVENTION

The present invention relates to a semiconductor device having a drive circuit element and an output transistor.

Hitherto, in power semiconductor devices manufactured by planar technology, for instance, as shown in FIG. 1, there is known a device which includes drive circuit elements 1 to 3 formed in the surface area of an $n^-$-type layer 4 formed on a p-type semiconductor substrate; and an output pnp transistor 5 having the $n^-$-type layer 4 as a base and the semiconductor substrate as a collector. The drive circuit element 1 is the p-channel MOS transistor formed in the surface area of the $n^-$-type layer 4. The drive circuit element 2 is the n-channel MOS transistor formed in a p-well formed in the surface region of the $n^-$-type layer 4. The drive circuit element 3 is the npn transistor having the $n^-$-type layer 4 as a collector. These drive circuit elements 1 to 3 are isolated from the output transistor 5 by a $p^+$-type isolation region 6.

In the semiconductor device in which the output transistor is constituted by the bipolar transistor as described above, an excellent saturation voltage characteristic is obtained; however, there are drawbacks such that it requires a large amount of drive power and its switching speed is slow. To eliminate such drawbacks, a method whereby the output transistor is constituted by a power MOS transistor has been considered, but in this case, the ON-resistance of the power MOS transistor is large; therefore, this necessitates an enlargement of the chip size to handle a current of the same magnitude as that of the bipolar transistor. Further in the case where an n-channel power MOS transistor having a larger current capacity than a p-channel MOS transistor is used, it is required to substitute an $n^+$-type layer for the $p^+$-type layer in the semiconductor substrate, making its structure complicated.

SUMMARY OF THE INVENTION

It is an object of the present invention to provide a semiconductor device having a simple structure in which the electric power required to drive it is small and which operates at a high speed.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the integrated semiconductor circuit of this invention comprises a semiconductor substrate of one conductivity type; a semiconductor layer of an opposite conductivity type formed on said semiconductor substrate and having an outer surface; an isolation region extending from said surface of the semiconductor layer to said semiconductor substrate to separate said semiconductor layer into first and second device forming regions; a drive circuit device formed in said first device forming region; at least one first semiconductor region of one conductivity type formed in the surface area of said second device forming region; a second semiconductor region of the opposite conductivity type formed in said first semiconductor region; and a gate electrode formed on an insulation layer which is itself formed on at least a portion of the first semiconductor region which lies between said second device forming region and said second semiconductor region, wherein said gate electrode, said first and second semiconductor regions, said second device forming region, and said semiconductor substrate form a conductivity modulated MOS transistor which constitutes an output circuit.

In this invention, the drain region is formed of the semiconductor substrate and the conductivity modulating (COM) FET, having a high resistance region whose conductivity is modulated and which is formed of the output circuit forming region, is used as the output transistor; therefore, it is possible to obtain a semiconductor device having a simple structure in which a driving electric power is small and which operates at a high speed.

The accompanying drawings, which are incorporated in and constitute a part of this specification, illustrate embodiments of the invention and, together with the description, serve to explain the principles of the invention.

BRIEF DESCRIPTION OF THE DRAWINGS

FIGS. 2A to 2D are schematic cross sectional diagrams of a semiconductor device having a COMFET as an output transistor constructed according to one embodiment of the present invention.

DETAILED DESCRIPTION OF THE PREFERRED EMBODIMENTS

Figure 1:
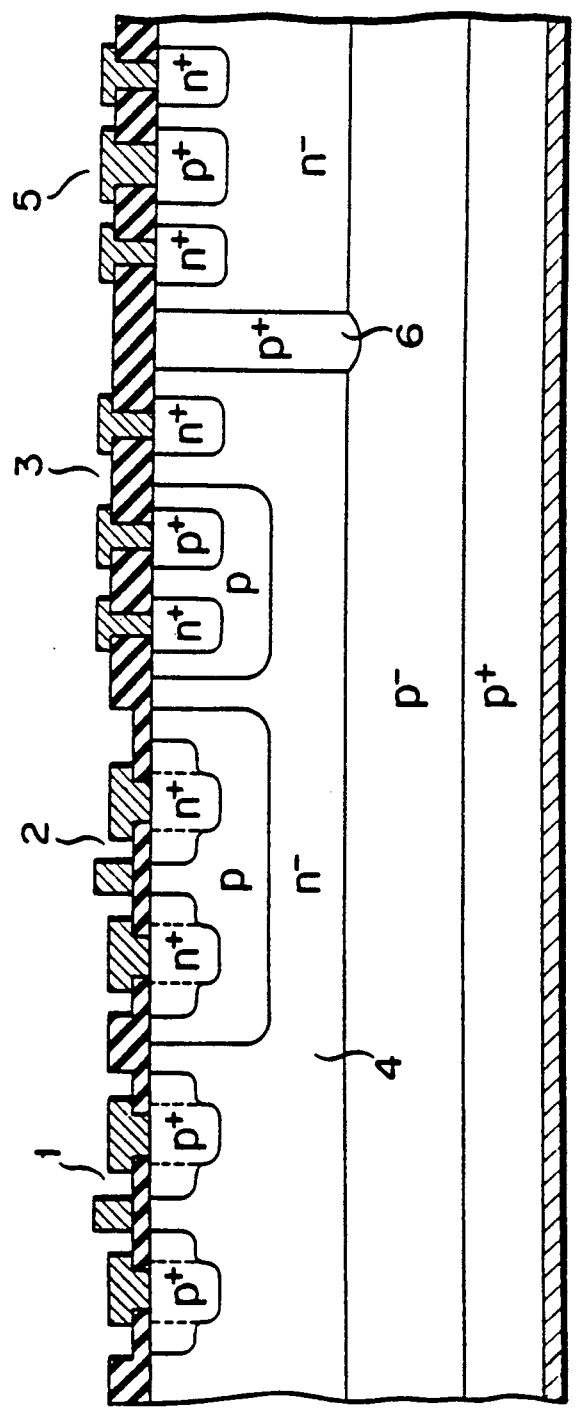
FIG. 1 is a schematic cross sectional diagram of a conventional semiconductor device having a drive circuit element and an output transistor.

A method of manufacturing a semiconductor device according to one embodiment of the present invention will now be described with reference to FIGS. 2A to 2D.

First, as shown in FIG. 2A, an $n^-$-type semiconductor layer 12 having a low impurity concentration is formed on a $p^+$-type semiconductor substrate 10 having a high impurity concentration by an epitaxial growth. Next, an insulation layer 14 is formed on the semiconductor layer 12 and a portion of the insulation layer 14 is selectively removed by an etching method. Thereafter, p-type impurities are doped to reach the substrate 10 from the opening portion of the insulation layer 14, thereby forming a $p^+$-type isolation layer 16 of a high impurity concentration. Due to this isolation layer 16, the $n^-$-type semiconductor layer 12 is divided into a first element forming region 12-1 in which drive circuit elements are formed and a second element forming region 12-2 in which a conductivity modulating element is formed.

Next, the semiconductor structure derived in FIG. 2A is subjected to an oxidation process under high temperature and thereafter as shown in FIG. 2B, windows 18-1 and 18-2 are formed in the insulation layer 14 on the first element forming region 12-1 and a window 18-3 is also formed in the insulation layer 14 on the second element forming region 12-2 by a photo etching method. Then, thin insulation layers 20-1 and 20-2 are formed on the exposed surfaces of the $n^-$-type layer 12-1 through the windows 18-1 and 18-2 and a thin insulation layer 20-3 is also formed on the exposed surface of the $n^-$-type layer 12-2 through the window 18-3. Thereafter, a gate electrode 22 of polycrystalline silicon is formed on the insulation layer 20-3. Next, boron is implanted into the $n^-$-type layer 12-2 through the insulation layer 20-3 in the window 18-3 using the gate electrode 22 as a mask by an ion implantation method. Thus, p-type regions 24-1 and 24-2, which serve as source regions of the COMFET, are formed.

Similarly, boron is implanted into the $n^-$-type layer 12-1 through the insulation layers 20-1 and 20-2 by an ion implantation method, thereby forming a p-well region 26 and a p-type region 28.

Next, predetermined portions of the insulation layer 20-3 are selectively removed to form windows and thereafter phosphorus or arsenic is implanted through these windows into the p-type regions 24-1 and 24-2 to have a high impurity concentration by the ion implantation technique. Thus, as shown in FIG. 2C, $n^+$-type regions 30-1 and 30-2 are respectively formed in the p-type regions 24-1 and 24-2. similarly, predetermined portions of the insulation layers 14, 20-1 and 20-2 are selectively removed to form windows and thereafter phosphorus or arsenic is implanted into the $n^-$-type layer 12-1, p-well region 26 and p-type region 28 through these windows to have a high impurity concentration by ion implantation technique. Therefore, $n^+$-type regions 32-1 and 32-2, which serve as a source and a drain, are formed in the p-well region 26. An $n^+$-type region 32-3, which serves as an emitter, is formed in the p-type region 28. An $n^+$-type region 32-4 is formed in the surface region of the $n^-$-type layer 12-1. Further, phosphorus or arsenic is ion-implanted to have a low impurity concentration in order to raise the withstanding voltage between the source 32-1 and the drain 32-2, thereby forming $n^-$-type regions 33-1 and 33-2. Next, predetermined portions of the insulation layers 14 and 20-2 are selectively removed to form windows and thereafter boron is ion implanted into the $n^-$-type layer 12-1 and p-type region 28 through these windows to have a high impurity concentration. Due to this, the $p^+$-type regions 34-1 and 34-2, which serve as a source and a drain, are formed in the surface area of the $n^-$-type layer 12-1. A $p^+$-type region 34-3 is formed in the surface area of the p-type region 28. Thereafter, boron is further ion-implanted to have a low impurity concentration in order to raise the withstanding voltage between the source 34-1 and the drain 34-2, thereby forming $p^-$-type regions 36-1 and 36-2. After that, a thick insulation layer 37 is newly formed on the semiconductor structure by a vapor phase growth method. Then, by selectively removing the insulation layer 37, gate regions including portions of the $n^+$-type regions 32-1 and 32-2 and the partial region of the p-well region 26 between the regions 32-1 and 32-2 and gate regions including portions of the $p^+$-type regions 34-1 and 34-2 and the partial region of the $n^-$-type layer 12-1 between the regions 34-1 and 34-2 are exposed. Thereafter, thin gate insulation films 38 and 40 are formed on those exposed gate regions by thermal oxidation method.

Next, the ion implantation and annealing treatment to control a threshold voltage are executed for the channel region between the $n^+$-type regions 32-1 and 32-2 and for the channel region between the $p^+$-type regions 34-1 and 34-2.

Thereafter, as shown in FIG. 2D, by forming electrodes on the gate insulation films 38 and 40, a COMMOS transistor TR1, n- and p-channel MOS transistors TR2 and TR3 are formed and contact holes are also formed in the insulation layer 37, thereby allowing the electrodes to come into contact with the polysilicon gate 22, the $n^+$-type regions 30-1 and 30-2, 32-1 to 32-4, and $p^+$-type regions 34-1 to 34-3 through the foregoing contact holes. In addition, the electrodes on the $n^+$-type regions 30-1 and 30-2 are also formed to come into contact with the p-type regions 24-1 and 24-2, respectively. Further, a drain electrode 44 is formed on the back surface of the substrate 10.

In the semiconductor device shown in FIG. 2D, a degree of conductivity of the $n^-$-type layer 12 can be increased by the minority carrier injected from the substrate 10 into the $n^-$-type layer 12-2 serving as a high resistance layer in operation. Thus, the electric power to drive this semiconductor device can be reduced; further, the resistance in the forward direction of this semiconductor device can also be made small, thereby making it possible to allow a large current to flow. In addition, for instance, by diffusing heavy metal into the $n^-$-type layer 12-2, the life time of the minority carrier implanted from the substrate 10 into the $n^-$-type layer 12-2 can be reduced, so that the high speed operation can be accomplished.

As described above, in this embodiment, a drain of the COMFET is formed of the substrate 10 and the drive circuit element is formed similarly to the $n^-$-type layer 12-1 which is formed, and the high resistance layer whose conductivity of the COMFET is modulated is formed of the $n^-$-type layer 12-2 isolated from the $n^-$-type layer 12-1 by the $p^+$-type region 16; therefore, this COMFET can be formed together with the manufacturing of the drive circuit elements without a large increase in the number of manufacturing steps.

Figure 3:
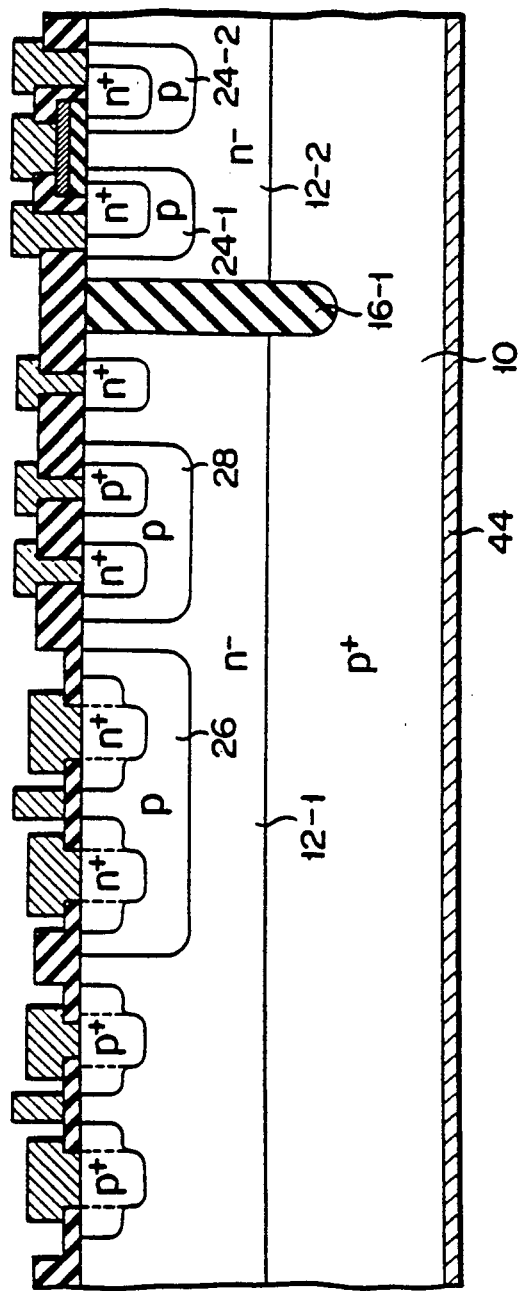
FIGS. 3 and 4 show modified forms of the construction of the semiconductor device shown in FIG. 2D, respectively.

Although the invention has been described in the above with respect to one embodiment, the invention is not limited to only this embodiment For instance, in place of the $p^+$-type region 16 to isolate the $n^-$-type layers 12-1 and 12-2, a silicon dioxide ($SiO_2$) layer or polycrystalline silicon layer 16-1 containing no impurity may be used as shown in FIG. 3.

Figure 4:
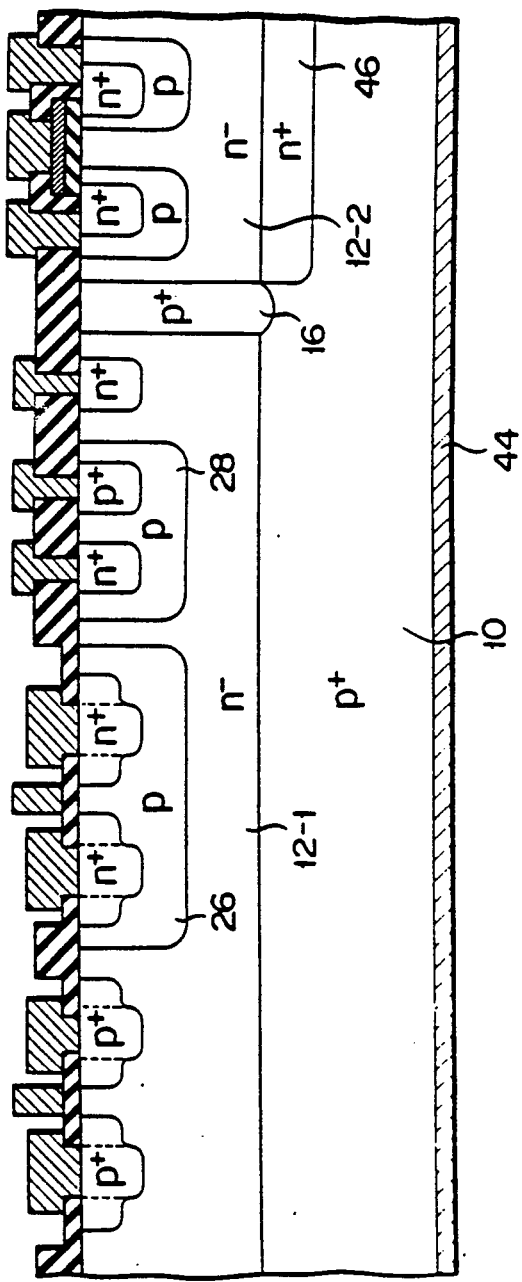

On the other hand, as shown in FIG. 4, an $n^+$-type region 46 is formed under the $n^-$-type layer 12-2, thereby enabling the operating speed to be further raised. Further, in place of the $p^+$-type substrate 10, an $n^+$-type substrate is used, thereby making it possible to change the conductivity type of the semiconductor region which is formed on this substrate.

What is claimed is:

1. An integrated semiconductor circuit having a drive circuit and a conductivity modulated MOS output transistor which has a high resistance layer whose conductivity can be modulated comprising:

a P type semiconductor substrate having a main surface and a back surface;

an N type semiconductor layer formed directly on said main surface of said P type semiconductor substrate and having an outer surface;

an isolation region extending from said outer surface of the semiconductor layer to said P type semiconductor substrate to separate said semiconductor layer into first and second device forming regions;

a drive circuit device formed in said first device forming region;

at least one P type semiconductor region formed in the surface area of said second device forming region;

an N type semiconductor region formed in each said P type semiconductor region;

an insulation layer formed on at least a portion of each said P type semiconductor region which lies between said second device forming region and said N type semiconductor region;

a gate electrode formed on said insulation layer; and a drain electrode formed on said back surface of said P type semiconductor substrate;

wherein said gate electrode, said P type and N type semiconductor regions, said second device forming region, and said P type semiconductor substrate form a vertically disposed conductivity modulated MOS transistor through which a current flows from said P type semiconductor substrate to said N type semiconductor region through said N type semiconductor layer and said P type semiconductor region in said second device forming region, said MOS transistor having a high resistance layer whose conductivity can be modulated and which constitutes an output circuit, and wherein holes injected from said P type semiconductor substrate into said N type semiconductor layer through a PN junction formed therebetween serve to increase the conductivity of said high resistance layer during operation of the circuit.

2. A semiconductor circuit according to claim 1, wherein said isolation region is a P type third semiconductor region.

3. A semiconductor circuit according to claim 2, wherein said conductivity modulated MOS transistor further has an N type fourth semiconductor region which is formed between said second device forming region and said semiconductor substrate and which has an impurity concentration higher than that of said second device forming region.

4. A semiconductor circuit according to claim 3, wherein said drive circuit device includes a MOS transistor of one-channel type formed in said first device forming region, a P type fifth semiconductor region formed in said first device forming region, and a MOS transistor of an opposite-channel type formed in said fifth semiconductor region.

5. A semiconductor circuit according to claim 2, wherein said drive circuit device includes a MOS transistor of one-channel type formed in said first device forming region, a P type fifth semiconductor region formed in said first device forming region, and a MOS transistor of an opposite-channel type formed in said fifth semiconductor region.

6. A semiconductor circuit according to claim 1, wherein said isolation region is an insulation region.

7. A semiconductor circuit according to claim 6, wherein said conductivity modulated MOS transistor further has an N type fourth semiconductor region which is formed between said second device forming region and said semiconductor substrate and which has an impurity concentration higher than that of said second device forming region.

8. A semiconductor circuit according to claim 7, wherein said drive circuit device includes a MOS transistor of one-channel type formed in said first device forming region, a P type fifth semiconductor region formed in said first device forming region, and a MOS transistor of an opposite-channel type formed in said fifth semiconductor region.

9. A semiconductor circuit according to claim 6, wherein said drive circuit device includes a MOS transistor of one-channel type formed in said first device forming region, a P type fifth semiconductor region formed in said first device forming region, and a MOS transistor of an opposite-channel type formed in said fifth semiconductor region.

10. A semiconductor circuit according to claim 1, wherein said conductivity modulated MOS transistor further has an N type fourth semiconductor region which is formed between said second device forming region and said semiconductor substrate and which has an impurity concentration higher than that of said second device forming region.

11. A semiconductor circuit according to claim 10, wherein said drive circuit device includes a MOS transistor of one-channel type formed in said first device forming region, a P type fifth semiconductor region formed in said first device forming region, and a MOS transistor of an opposite-channel type formed in said fifth semiconductor region.

12. A semiconductor circuit according to claim 1, wherein said drive circuit device includes a MOS transistor of one-channel type formed in said first device forming region, a P type fifth semiconductor region formed in said first device forming region, and a MOS transistor of an opposite-channel type formed in said fifth semiconductor region.

13. A semiconductor circuit according to claim 1, wherein said second device forming region is a high resistance layer whose conductivity is modulated by the injection of carriers from said semiconductor substrate.

* * * * *